United States Patent [19]
Teng et al.

[11] Patent Number: 5,734,302
[45] Date of Patent: Mar. 31, 1998

[54] DC FREQUENCY MODULATION CIRCUIT USING TWO PHASE LOCKED LOOPS

[75] Inventors: Chih-Yuan Teng; Ming-Ho Hung; Tien Cheng Tseng, all of Chutung, Taiwan

[73] Assignee: Industrial Technology Research Institute, Hsinchu, Taiwan

[21] Appl. No.: 726,602

[22] Filed: Oct. 7, 1996

[51] Int. Cl.$^6$ .............................. H03C 3/08; H03C 3/09; H03L 7/22

[52] U.S. Cl. .......................... 332/128; 331/2; 331/23; 455/113; 455/119

[58] Field of Search .................... 332/127, 128; 455/75, 76, 113, 119; 331/2, 23

[56] References Cited

U.S. PATENT DOCUMENTS

| | | | |
|---|---|---|---|
| 3,622,913 | 11/1971 | Shipley | 332/128 |
| 4,512,353 | 4/1985 | Chaplik et al. | 332/127 |
| 4,682,124 | 7/1987 | Schutz | 332/127 |

*Primary Examiner*—Siegfried H. Grimm
*Attorney, Agent, or Firm*—Bacon & Thomas

[57] ABSTRACT

A DC frequency modulation circuit for modulating audio signals wherein the high frequencies of the audio signals are modulated by a first phase locked loop and the low frequencies of the audio signals, along with the DC signals, are filtered by a low pass filter, applied through an A/D converter, and modulated by a direct digital frequency synthesizer. The two modulated signals are then mixed by a second phase locked loop.

2 Claims, 1 Drawing Sheet

5,734,302

1

DC FREQUENCY MODULATION CIRCUIT USING TWO PHASE LOCKED LOOPS

FIELD OF THE INVENTION

The present invention relates to a DC frequency modulation circuit, especially to a circuit which modulates frequency with a phase locked loop in order to generate synthesized carrier signals.

BACKGROUND OF THE INVENTION

The phase locked loop, which can modulate DC frequency in order to generate synthesized carrier signals, is popularly used in the signal generator and in the frequency synthesizer. In the conventional art, however, only audio signals with frequencies higher than the operational band of the phase locked loop can be modulated. For audio signals with frequencies lower than the operational band of the phase locked loop, they are treated as noises and are filtered out by the phase locked loop. As a result, the conventional phase locked loop is not suited in the application of modulating audio signals with lower frequencies or DC audio signals. In the application, if lower frequencies shall be modulated, a user can not but interrupt the phase locked loop.

U.S. Pat. No. 4,682,124 (issued to Johann Schutz) relates to a 'Circuit including a DC-FM Phase Locked Loop' which is used in transmitters for measuring and control purposes, wherein the modulation signal controls, via an A/D converter, the output frequency of a frequency synthesizer. This output frequency is used as the reference for the phase comparator. This invention permits modulation with extremely low frequencies or DC without the necessity to interrupt the loop and is deemed an improvement to the conventional art.

OBJECTS OF THE INVENTION

The object of this invention is to provide a DC frequency modulation circuit suited for modulating the frequencies of DC audio signals.

Another object of this invention is to provide a DC frequency modulation circuit which can modulate high frequencies and low frequencies of audio signals simultaneously.

BRIEF DESCRIPTION OF THE INVENTION

According to the present invention, a DC frequency modulation circuit is provided. In the DC frequency modulation circuit of this invention, the high frequencies of the audio signals are modulated by a conventional phase locked loop and the low frequencies and the DC signals are modulated by a digital frequency synthesizer. The two groups of modulation signals are mixed in another phase locked loop.

These and other objects and advantages of this invention may be fully understood from the detailed specification by referring to the following drawing:

IN THE DRAWING.

FIG. 1 illustrates the circuit diagram of the DC frequency modulation circuit of an embodiment of this invention.

DETAILED DESCRIPTION OF THE INVENTION

Figure 1:
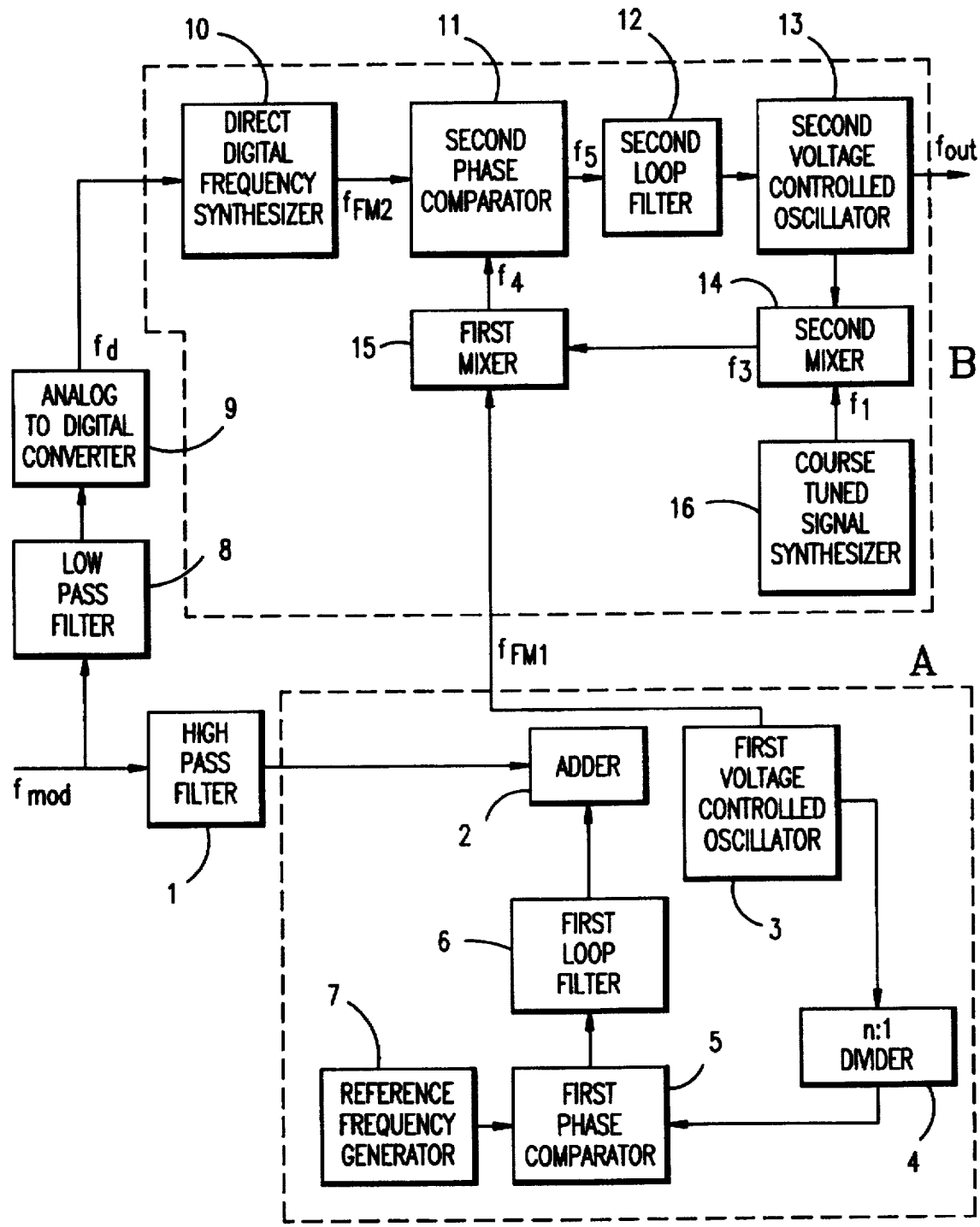

FIG. 1 illustrates the circuit diagram of the DC frequency modulation circuit of an embodiment of this invention. As shown in the figure, the DC frequency modulation circuit of this invention comprises: a first phase locked loop A and a second phase locked loop B. In addition, it further comprises a high pass filter 1 and a low pass filter 8.

The first phase locked loop A includes: an adder 2, a first voltage controlled oscillator 3, an n:1 divider 4, a first phase comparator 5 and a first loop filter 6.

During the modulation of audio signals, the high pass filter 1 filters out the low frequencies (such as those lower than 20 Hz) of the audio signals $f_{mod}$. The audio signals $f_{mod}$ so filtered are applied to the first phase locked loop A via adder 2. Here, only the high frequencies (such as those higher than 20 Hz) of the audio signals are modulated.

The modulation of the audio signals in the first phase locked loop is as follows:

High frequencies of the audio signals filtered by the high pass filter 1 are applied to the first voltage controlled oscillator 3 and frequency modulation signals $f_{FM1}$ are generated at the voltage controlled oscillator 3.

The output of the voltage controlled oscillator 3 is applied to the divider 4 to be divided with a ratio n:1 and then to the first phase comparator 5. The first phase comparator 5 compares the phases of the audio signals with the phases of a reference frequency $f_{ref}$ generated by the reference frequency generator 7, picks up the differences of the phases and applies them to the adder 2 via the first loop filter 6. The adder 2 generates feedback control signals, in response to the output of the first phase comparator 5, to control the output frequency of the first voltage controlled oscillator 3.

On the other hand, the low frequencies (such as those lower than 20 Hz) of the audio signals $f_{mod}$, as filtered by the low pass filter 8, are applied to the second phase locked loop B through an analog-to-digital converter 9.

The second phase locked loop B includes: a direct digital frequency synthesizer 10, a coarce tuned signal synthesizer 16 which generates carrier signals $f_t$ with wider frequency steps (such as, divided by 1 MHz), a second phase comparator 11, a second loop filter 12, a second voltage controlled oscillator 13, a first mixer 15 and a second mixer 14.

When the low frequencies of the audio signals are applied to the analog to digital converter 9, these analog signals are converted into digital signals $f_d$. The digitized signals $f_d$ are applied to the direct digital frequency synthesizer 10 to generate frequency modulation signals $f_{FM2}$, in response to the variation of the low frequencies of the audio signals $f_{mod}$. Here, the modulation signals $f_{FM2}$ do not only vary in response to the low frequency components of the audio signals $f_{mod}$ but also to the DC frequencies thereof. The modulation signals $f_{FM2}$ modulated by the direct digital frequency synthesizer 10 are then mixed with the frequency modulation signals $f_{FM1}$, modulated by the first phase locked loop A.

In mixing the signals, the output modulated signals $f_{FM1}$ of the first voltage controlled oscillator 3 are applied to the second phase comparator 11 via the first mixer 15. The second phase comparator 11 compares the differences of the phases of the modulated signals $f_{FM1}$ and the phases of the frequency modulated signals $f_{FM2}$, output by the direct digital frequency synthesizer 10, and outputs the phase differences. The phase differences are then applied to the second voltage controlled oscillator 13 via the second loop filter 12. The second voltage controlled oscillator 13 outputs frequency modulated signals $f_{out}$.

The output of the second voltage controlled oscillator 13 is also applied to the second mixer 14 to be mixed with the carrier signals $f_t$ generated by the coarse tuned signal synthesizer 16. The mixed signals are applied to the first mixer 15 to be mixed with the output of the modulated signals of the first voltage controlled oscillator 3. The then mixed signals are applied to the second phase comparator 11 which compares the phase differences of the then mixed signals $f_4$ and the output modulated signals $f_{FM2}$ of the direct digital frequency synthesizer 10 to generate feedback control signals.

The output frequency-modulated signals $f_{out}$ of the second voltage controlled oscillator 13 possess the characteristics of the high frequencies, the low frequencies and the DC frequencies of the audio signals $f_{mod}$.

The characteristics of the output signals $f_{out}$ of the second voltage controlled oscillator 13 may be analyzed as follows:

The second mixer 14 picks up the frequency differences $f_3$ of the output signals $f_{out}$ of the second voltage controlled oscillator 13 and the output signals $f_t$ of the coarse tuned synthesizer 16, as follows:

$$f_3 = f_{out} - f_t \quad (1)$$

The first mixer 15 picks up the frequency differences $f_4$ of the output signals $f_3$ of the second mixer 14 and the output signals $f_{FM1}$ of the first voltage controlled oscillator 13, as follows:

$$f_4 = f_3 - f_{FM1} \quad (2)$$

The second phase comparator 11 picks up the frequency differences $f_5$ of the output signals $f_4$ of the first mixer 15 and the output signals $f_{FM2}$ of the direct digital frequency synthesizer 10, as follows:

$$f_5 = f_4 - f_{FM2} \quad (3)$$

The second loop filter 12 picks up the output DC components of the second phase comparator 11 and inputs them to the second voltage controlled oscillator 13 as its input voltage. When the second phase locked loop B is in a locking state, $f_5$ is 0:

$$f_5 = 0 \quad (4)$$

From equations (3) and (4), we have:

$$f_4 = f_{FM2} \quad (5)$$

From equations (5) and (2), we have:

$$f_3 = f_4 + f_{FM1} = f_{FM2} + f_{FM1} \quad (6)$$

From equations (6) and (1), we have:

$$f_{out} = f_t + f_3 = f_t + f_{FM1} + f_{FM2} \quad (7)$$

In equation (7), it is shown that the output frequency-modulated signals $f_{out}$ of the second voltage controlled oscillator 13 include frequency signals $f_{FM1}$ and frequency signals $f_{FM2}$ where $f_{FM1}$ varies in response to the high frequencies of the audio signals $f_{mod}$ and $f_{FM2}$ varies in response to the low frequencies of the audio signals $f_{mod}$. The combination of $f_{FM1}$ and $f_{FM2}$ covers all the band width of the audio signals $f_{mod}$. In other words, the audio signals $f_{mod}$ are modulated at the same time.

As the embodiments of the present invention are described above, it is to be understood that the embodiments are merely illustrative principles of the invention and that any variations may be derived by those skilled in the art without departing from the scope of the invention. It is, therefore, intended that such variations are included within the scope of the appended claims.

What is claimed is:

1. A DC frequency modulation circuit to modulate audio signals comprising:

a high pass filter to filter out the lower frequencies of said audio signals;

a first phase locked loop to modulate the higher frequencies of said audio signals;

a low pass filter to pick up the lower frequencies of said audio signals; and a second phase locked loop to modulate the lower frequencies of said audio signals and to mix the modulated signals with the modulated signals modulated by said first phase locked loop;

wherein said second phase locked loop comprises:

a digital frequency synthesizer to modulate the lower frequencies of said audio signals;

a voltage controlled oscillator to generate oscillation signals in response to an input voltage;

a coarse adjustment synthesizer to generate carrier signals with wider frequency steps;

a first mixer to be fed output signals of said coarse adjustment synthesizer and said voltage controlled oscillator, to pick up the differences of frequencies of said output signals and to output said differences;

a second mixer to be fed output signals of said first mixer and said first phase locked loop, to pick up the differences of frequencies of said output signals and to output said differences;

a phase comparator to be fed output of said digital frequency synthesizer and said second mixer, to pick up the differences of frequencies of said output signals and to output said differences; and a loop filter to pick up the DC output of said phase comparator and input it into said voltage controlled oscillator as its input voltage.

2. The DC frequency modulation circuit of claim 1 wherein said first phase locked loop comprises an adder, a voltage controlled oscillator, a divider, a reference frequency generator, a phase comparator and a loop filter.

* * * * *